United States Patent
Yanagita et al.

(10) Patent No.: US 6,852,187 B2
(45) Date of Patent: Feb. 8, 2005

(54) METHOD AND APPARATUS FOR SEPARATING MEMBER

(75) Inventors: Kazutaka Yanagita, Kanagawa (JP); Mitsuharu Kohda, Kanagawa (JP); Kiyofumi Sakaguchi, Kanagawa (JP); Akira Fujimoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 303 days.

(21) Appl. No.: 10/178,359

(22) Filed: Jun. 25, 2002

(65) Prior Publication Data

US 2003/0010445 A1 Jan. 16, 2003

(30) Foreign Application Priority Data

Jun. 29, 2001 (JP) ........................................ 2001-199345

(51) Int. Cl.[7] ............................................. B32B 31/00
(52) U.S. Cl. ........................ 156/239; 156/344; 83/177; 438/455; 438/458
(58) Field of Search ................................ 156/239, 344, 156/529, 584; 83/177; 438/455, 458

(56) References Cited

U.S. PATENT DOCUMENTS

| | | | | |
|---|---|---|---|---|
| 1,661,672 A | * | 3/1928 | Morrison ..................... | 175/424 |
| 3,924,698 A | * | 12/1975 | Juvkam-Wold ............. | 175/393 |
| 3,960,407 A | * | 6/1976 | Noren ......................... | 299/17 |
| 4,119,160 A | * | 10/1978 | Summers et al. ............. | 175/67 |
| 5,371,037 A | | 12/1994 | Yonehara ..................... | 437/86 |
| 5,605,492 A | * | 2/1997 | Klingel ........................ | 451/40 |
| 6,100,166 A | | 8/2000 | Sakaguchi et al. .......... | 438/455 |
| 6,294,478 B1 | | 9/2001 | Sakaguchi et al. .......... | 438/753 |
| 6,382,292 B1 | | 5/2002 | Ohmi et al. ................. | 156/584 |
| 6,436,226 B1 | * | 8/2002 | Omi et al. ................... | 156/344 |
| 6,653,205 B2 | * | 11/2003 | Yanagita et al. ............ | 438/455 |
| 2002/0047235 A1 | * | 4/2002 | Allner et al. ................. | 271/98 |
| 2002/0174958 A1 | * | 11/2002 | Yanagita et al. ............ | 156/584 |
| 2002/0174959 A1 | * | 11/2002 | Yanagita et al. ............ | 156/584 |
| 2003/0003687 A1 | * | 1/2003 | Yanagita et al. ............ | 438/458 |

FOREIGN PATENT DOCUMENTS

| | | |
|---|---|---|
| JP | 5-21338 | 1/1993 |
| JP | 11-45840 | 2/1999 |

* cited by examiner

*Primary Examiner*—Mark A. Osele
(74) *Attorney, Agent, or Firm*—Fitzpatrick, Cella, Harper & Scinto

(57) ABSTRACT

This invention is to appropriately separate a bonded substrate stack regardless of some distortion in the bonded substrate stack or the like. This separating apparatus includes a first nozzle which forms a jet with a large width and a second nozzle which forms a jet with a small width. When the outer portion of a bonded substrate stack is to be separated, a jet formed by the first nozzle is used. After that, when a portion inside the outer portion is to be separated, a jet formed by the second nozzle is used.

17 Claims, 10 Drawing Sheets

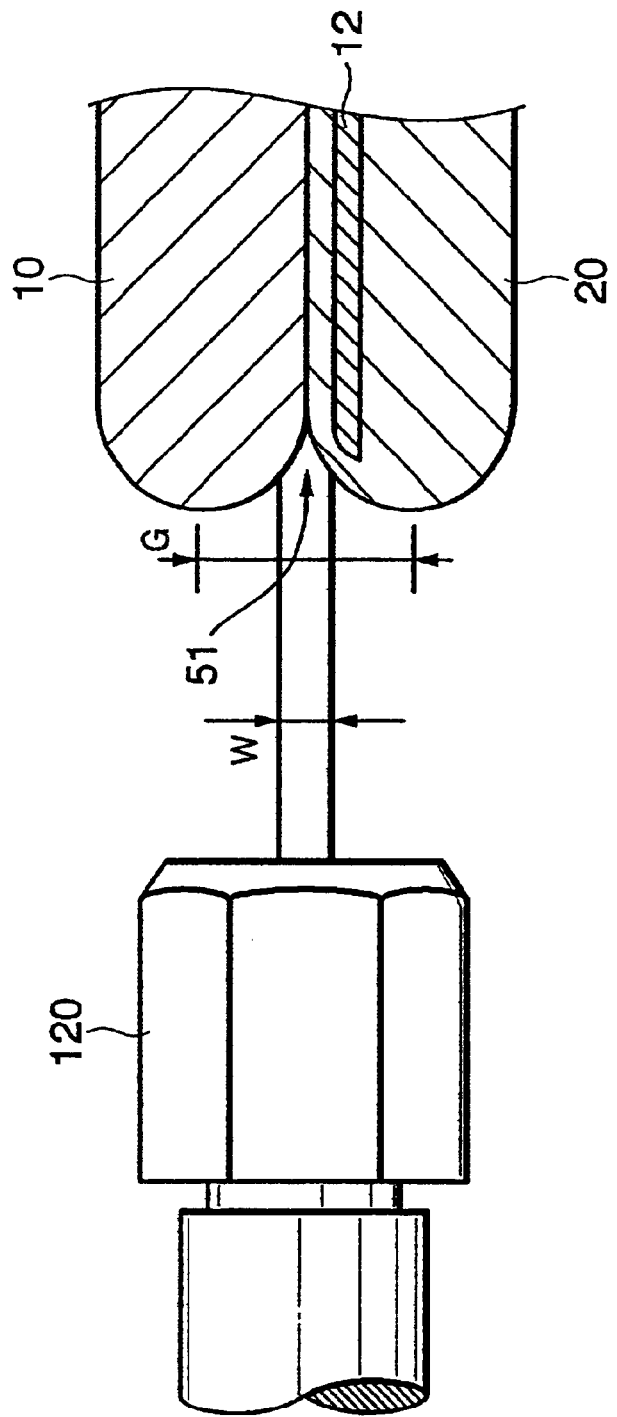

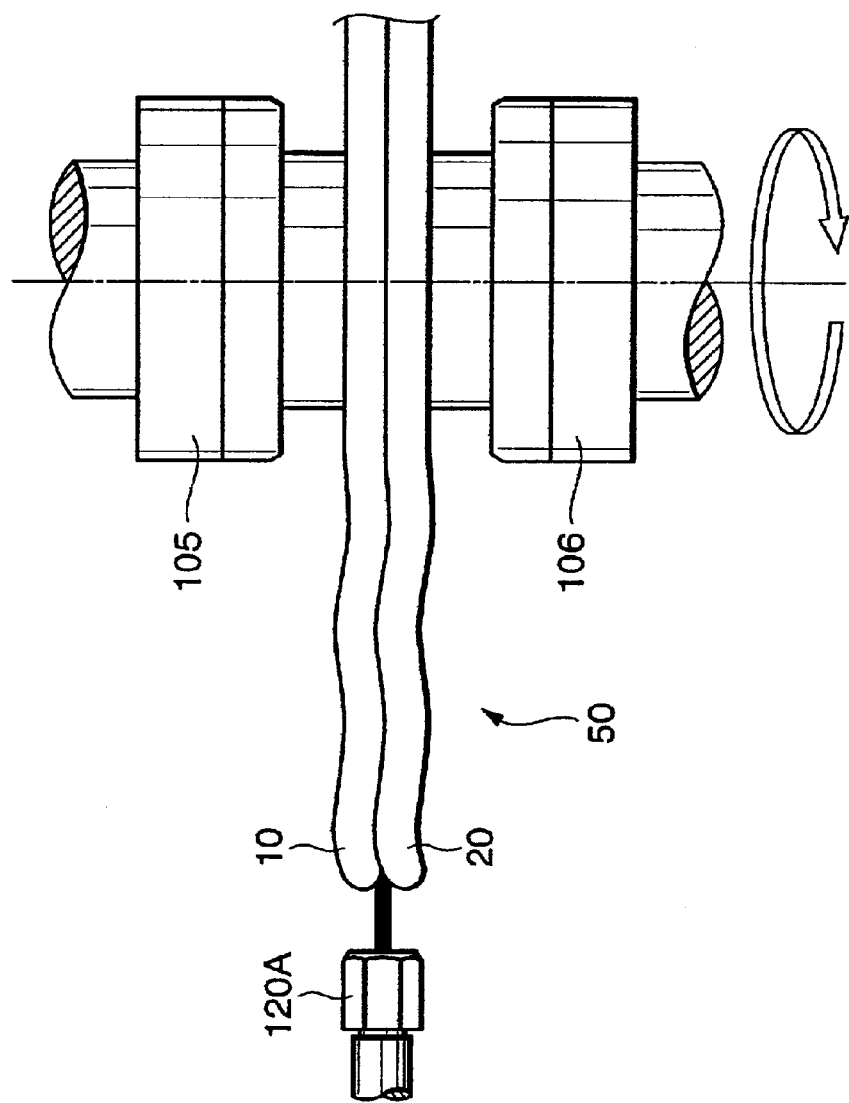

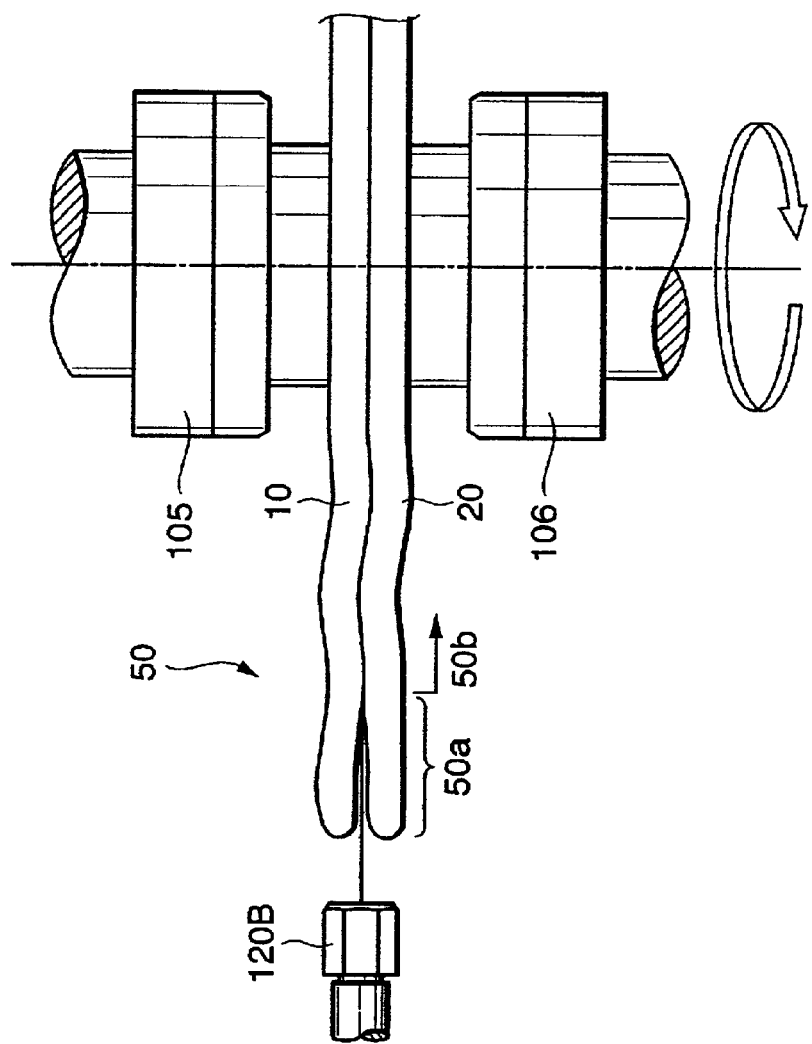

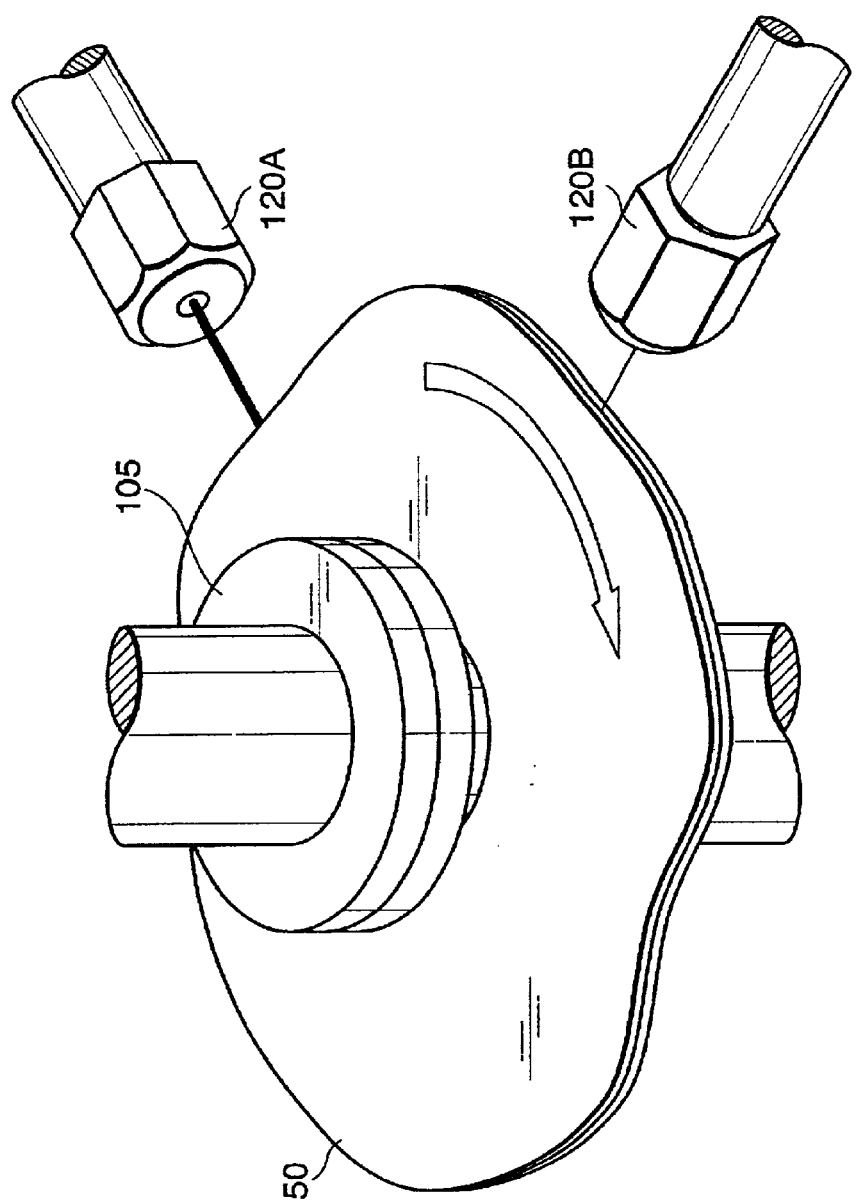

W1 > W2

W1 > W2

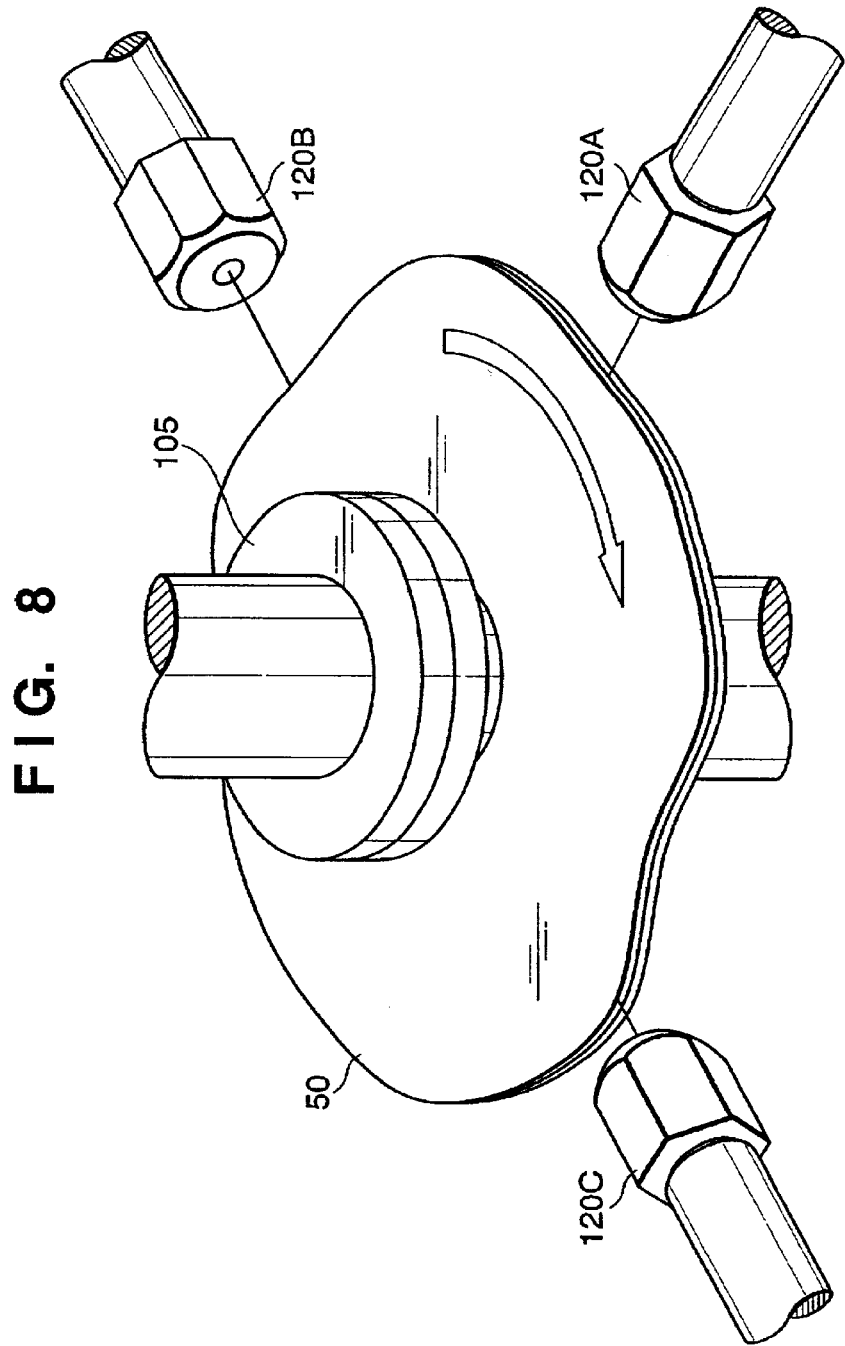

METHOD AND APPARATUS FOR SEPARATING MEMBER

FIELD OF THE INVENTION

The present invention relates to an apparatus separating a member such as a bonded substrate stack, a processing method therefor, a semiconductor substrate manufacturing method, and a semiconductor device manufacturing method.

BACKGROUND OF THE INVENTION

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A fully depleted field effect transistor can be formed by thin film formation.

Since an SOI structure has the above various advantages, researches have been made on its formation method for several decades.

As a method, an SOI structure is formed by bonding a single-crystal Si substrate to another thermally oxidized single-crystal Si substrate by annealing or an adhesive. In this method, an active layer for forming a device must be uniformly thin. More specifically, a single-crystal Si substrate having a thickness of several hundred micron must be thinned down to the micron order or less.

To thin the substrate, polishing or selective etching can be used.

A single-crystal Si substrate can hardly be uniformly thinned by polishing. Especially, in thinning to the submicron order, the variation range is several ten %. As the wafer size becomes large, this difficulty becomes more pronounced.

The present applicant has disclosed a new SOI technique in Japanese Patent Laid-Open No. 5-21338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred-Å to 10-$\mu$m thick SOI films can be manufactured by a single manufacturing apparatus.

To separate the bonded first and second substrates into two substrates without breaking the first and second substrates, the following methods are available: the two substrates are pulled in opposite directions while applying a force in a direction perpendicular to the bonding interface; a shearing force is applied parallel to the bonding interface (for example, the two substrates are moved in opposite directions in a plane parallel to the bonding interface, or the two substrates are rotated in opposite directions while applying a force in the circumferential direction); pressure is applied in a direction perpendicular to the bonding interface; a wave energy such as an ultrasonic wave is applied to the separation region; a peeling member (e.g., a sharp blade such as a knife) is inserted into the separation region parallel to the bonding interface from the side surface side of the bonded substrate stack; the expansion energy of a substance filling the pores of the porous layer functioning as the separation region is used; the porous layer functioning as the separation region is thermally oxidized from the side surface of the bonded substrate stack to expand the volume of the porous layer and separate the substrates; and the porous layer functioning as the separation region is selectively etched from the side surface of the bonded substrate stack to separate the substrates.

As a method of separating a bonded substrate stack, the present applicant disclosed an epoch-making technique in Japanese Patent Laid-Open No. 11-45840 (Japanese Patent No. 2,877,800). In the separating method described in Japanese Patent Laid-Open No. 11-45840, a bonded substrate stack having a porous layer or ion implantation layer serving as a separation layer is separated into two substrates by injecting a fluid into the side surface of the bonded substrate.

More specifically, in the separating method described in Japanese Patent Laid-Open No. 11-45840, the bonded substrate stack is held by a pair of holders (substrate holding portions) having a smaller size than that of the bonded substrate stack. A fluid is injected into the side surface of the bonded substrate stack while rotating it, thereby separating the bonded substrate stack into two substrates at the porous layer.

In holding the bonded substrate stack by the pair of holders, which have a size smaller than that of the bonded substrate stack, distortion may occur at the outer portion due to its own weight or the like, or the bonded substrate stack may be held with some distortion which has occurred in the manufacturing process remaining without being corrected. Assume that distortion exists in the bonded substrate stack held by holders. In this case, when a fluid is to be injected throughout the perimeter of the bonded substrate stack while rotating it, the fluid may be injected to a position deviated from an appropriate position (e.g., a bonding interface or separation layer).

For the sake of easy understanding, an extreme case will be described. For example, if the bonded substrate stack is largely distorted, a fluid injected from a nozzle, the position of which has been adjusted on the assumption that the bonded substrate stack is not distorted, is not injected to the separation layer or bonding interface of the bonded substrate stack. When this occurs, separation processing may not progress at all. This will be described with reference to FIG. 10.

FIG. 10 shows a state wherein a bonded substrate stack 50 which is largely distorted is separated into two substrates at a separation layer 12. In the example shown in FIG. 10, the position of the actual separation layer 12 largely deviates from that of a separation layer without any distortion (the ideal position of the separation layer). In this case, the position of a nozzle 120 is adjusted on the assumption that the separation layer 12 is arranged at the ideal position. When separation is performed in this state, a fluid from the nozzle 120 is not injected into the separation layer 12, thereby preventing smooth separation. If large distortion exists at the perimeter of the bonded substrate stack 50, separation does not progress speedily. This may result in unsatisfactory separation.

The probability of the above-described unsatisfactory separation would increasingly become higher due to increase in size of a bonded substrate stack along with increase in size of a required SOI substrate.

In addition, in holding a bonded substrate stack by holders, some foreign substance may enter between the bonded substrate stack and holders. In this case as well, a fluid from a nozzle may be injected into a position deviated from the separation layer or bonding interface of the bonded substrate stack.

SUMMARY OF THE INVENTION

The present invention has been made in consideration of the above situation, and has as its object to guarantee that in separating a member having a separation layer such as a bonded substrate stack, the member can be appropriately separated regardless of some distortion in the member, insufficient accuracy in holding the member, or the like.

According to the first aspect of the present invention, there is provided a method of separating a member which has a separation layer inside using a jet, characterized by comprising the first step of injecting a jet with a first width into an outer portion of the member to separate the outer portion of the member, and the second step of injecting a jet with a second width smaller than the first width into the member to separate the member.

According to a preferred aspect of the present invention, it is preferable that in the first step, a pressure of the jet with the first width be applied to the separation layer at the outer portion, and in the second step, a pressure of the jet with the second width is applied to the separation layer at a portion inside the outer portion of the member.

According to a preferred aspect of the present invention, the first and second widths are, for example, widths in a direction of thickness of the separation layer.

According to a preferred aspect of the present invention, the jet with the first width and the jet with the second width are formed by, e.g., ejecting mechanisms different from each other.

According to a preferred aspect of the present invention, for example, the pressure of the jet with the first width is higher than that of the jet with the second width.

According to a preferred aspect of the present invention, the second step is preferably performed after the outer portion of the member is separated almost throughout a perimeter of the member in the first step. Alternatively, the first step and second step are preferably performed simultaneously during part of an entire period from a beginning to end of separation processing.

According to a preferred aspect of the present invention, preferably, the first width is 0.5 to 1 mm, and the second width is 0.05 to 0.5 mm.

According to a preferred aspect of the present invention, preferably, the pressure of the jet with the first width is 500 to 1,000 $kgf/cm^2$, and the pressure of the jet with the second width is 50 to 500 $kgf/cm^2$.

According to a preferred aspect of the present invention, the member is preferably rotated about an axis perpendicular to the separation layer in the first step and/or the second step.

According to a preferred aspect of the present invention, the member preferably comprises a bonded substrate stack obtained by bonding a seed substrate which has a semiconductor layer on a separation layer to a handle substrate through an insulating layer.

According to a preferred aspect of the present invention, the jet is obtained by ejecting a liquid or gas from an ejecting portion.

According to the second aspect of the present invention, there is provided an apparatus for separating a member which has a separation layer inside using a jet, characterized by comprising a holding portion for holding a member, a plurality of ejecting mechanisms for forming jets which apply a pressure to the separation layer of the member held by the holding portion, wherein the plurality of ejecting mechanisms form a plurality of jets having widths different from each other.

According to a preferred aspect of the present invention, the plurality of ejecting mechanisms form a plurality of jets having widths different from each other in a direction of thickness of the separation layer of the member.

According to a preferred aspect of the present invention, preferably, the plurality of ejecting mechanisms comprise a first ejecting mechanism for forming a first jet with a first width, a second ejecting mechanism for forming a second jet with a second width smaller than the first width, the first ejecting mechanism is so adjusted as to cause a pressure of the first jet to be applied to an outer portion of the member, and the second ejecting mechanism is so adjusted as to cause a pressure of the second jet to be applied to the separation layer inside the outer portion.

According to a preferred aspect of the present invention, the pressure of the first jet is higher than, e.g., that of the second jet.

According to a preferred aspect of the present invention, the second ejecting mechanism preferably forms the second jet after the outer portion of the member is separated throughout a perimeter of the member using the first jet from the first ejecting mechanism.

According to a preferred aspect of the present invention, preferably, the first ejecting mechanism and second ejecting mechanism respectively form the first jet and second jet during part of an entire period from a beginning to end of separation processing.

According to a preferred aspect of the present invention, preferably, the first width is 0.5 to 1 mm, and the second width is 0.05 to 0.5 mm.

According to a preferred aspect of the present invention, preferably, the pressure of the jet with the first width is 500 to 1,000 $kgf/cm^2$, and the pressure of the jet with the second width is 50 to 500 $kgf/cm^2$.

According to a preferred aspect of the present invention, preferably, this separating apparatus further comprises a rotating mechanism for rotating the member about an axis perpendicular to the separation layer during separation processing.

According to a preferred aspect of the present invention, the member preferably comprises a bonded substrate stack obtained by bonding a seed substrate which has a semiconductor layer on a separation layer to a handle substrate through an insulating layer.

According to a preferred aspect of the present invention, the jet is obtained by ejecting a liquid or gas from an ejecting portion.

According to the third aspect of the present invention, there is provided an apparatus for separating a member which has a separation layer inside by injecting a jet into the member, characterized by comprising a holding portion which has a holding surface for holding a member, and a plurality of ejecting mechanisms for forming jets which apply a pressure to the separation layer of the member held by the holding portion, wherein the plurality of ejecting mechanisms form a plurality of jets having widths different from each other in a direction perpendicular to the holding surface.

According to the fourth aspect of the present invention, there is provided a semiconductor substrate manufacturing method characterized by comprising the steps of forming a bonded substrate stack as a member to be separated by bonding to a second substrate a first substrate which has a separation layer inside and a transfer layer on the separation layer, and separating the bonded substrate stack at the separation layer by using the above separating method.

According to the fifth aspect of the present invention, there is provided a semiconductor device manufacturing method characterized by comprising the steps of preparing an SOI substrate manufactured using the above manufacturing method, and element-isolating an SOI layer of the SOI substrate and forming a transistor on the element-isolated SOI layer.

The transistor may be a partially depleted FET or fully depleted FET.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is an enlarged view of a nozzle and bonded substrate stack;

FIG. 4 is a view showing a state wherein the outer portion of a bonded substrate stack is separated using a first jet with a first width from a first nozzle;

FIG. 5 is a view showing a state wherein a portion inside the outer portion of the bonded substrate stack is separated using a second jet with a second width from a second nozzle;

FIG. 6 is a view showing an example of the positional relationship between the first and second nozzles, and the bonded substrate stack;

FIG. 8 is a view showing a modification of the separating apparatus shown in FIG. 2;

DETAILED DESCRIPTION OF THE PREFERRED EMBODIMENTS

Figure 1A:
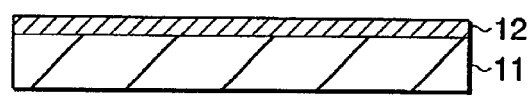
FIGS. 1A to 1E are views for explaining a method of manufacturing a substrate having, e.g., an SOI structure according to a preferred embodiment of the present invention.

Preferred embodiments of the present invention will be described below with reference to the accompanying drawings.

A separating apparatus according to a preferred embodiment of the present invention comprises substrate holding portions (holders) for holding a bonded substrate stack and a plurality of ejecting mechanisms (nozzles), which form a jet by ejecting a fluid. The plurality of ejecting mechanisms include a first ejecting mechanism which forms a first jet with a first width and a second ejecting mechanism which forms a second jet with a second width smaller than the first width. The first jet is used to separate the outer portion of the bonded substrate at a separation layer, and the second jet is used to separate a portion inside the outer portion of the bonded substrate at the separation layer.

In some cases, a bonded substrate stack may be distorted, or the bonded substrate stack may be held at a position deviated from an appropriate position (designed position) due to some foreign substance between the substrate holding portions and bonded substrate stack. In these cases, a fluid (jet) ejected from the ejecting mechanisms (nozzles), which have been positioned on the assumption that the separation layer or bonding interface of the bonded substrate stack is located at the appropriate position, is injected into a position deviated from the separation layer or bonding interface.

Under the circumstances, when the outer portion of the bonded substrate stack is to be separated as described above, a relatively wider jet is used. This makes it possible to reliably separate the outer portion even if the separation layer or bonding interface deviates from the appropriate position.

When a wide jet is used, the amount of a fluid injected into the bonded substrate increases, depending on the width of the jet. If the amount of the fluid injected into the bonded substrate stack increases excessively, the bonded substrate stack may be damaged under an excessive pressure from the fluid therein. When a portion inside the outer portion (e.g., the central portion) of the bonded substrate stack is to be separated, it is therefore preferable that the width of a jet is so decreased as to decrease the amount of the fluid to be injected into the bonded substrate stack. For this reason, in this embodiment, when the portion inside the outer portion (e.g., the central portion) of the bonded substrate stack is to be separated, a jet with the second width smaller than the first width is used. To separate the bonded substrate stack, a wide jet can be used while the bonded substrate stack is rotated at least once, preferably five times, and then the wide jet can be switched to a narrow jet. Needless to say, jets having two kinds of widths may be used simultaneously in the step of separating the outer portion, and afterwards, one with the larger width may be stopped.

Note that even a jet with a somewhat large width causes no problems in separation of the outer portion of the bonded substrate stack because the bonded substrate stack has a number of escapes (discharge paths) for an injected fluid.

Preferably, a bonded substrate stack to be separated has a concave portion in its outer side. The positional relationship is so changed as to cause a fluid to be injected into the concave portion throughout the perimeter of the bonded substrate stack. This concave portion can be formed by manufacturing a bonded substrate stack using the first substrate (seed wafer) and second substrate (handle wafer). Each of the first and second substrates employs a wafer which has a beveling portion with a round sectional shape.

Figure 2:
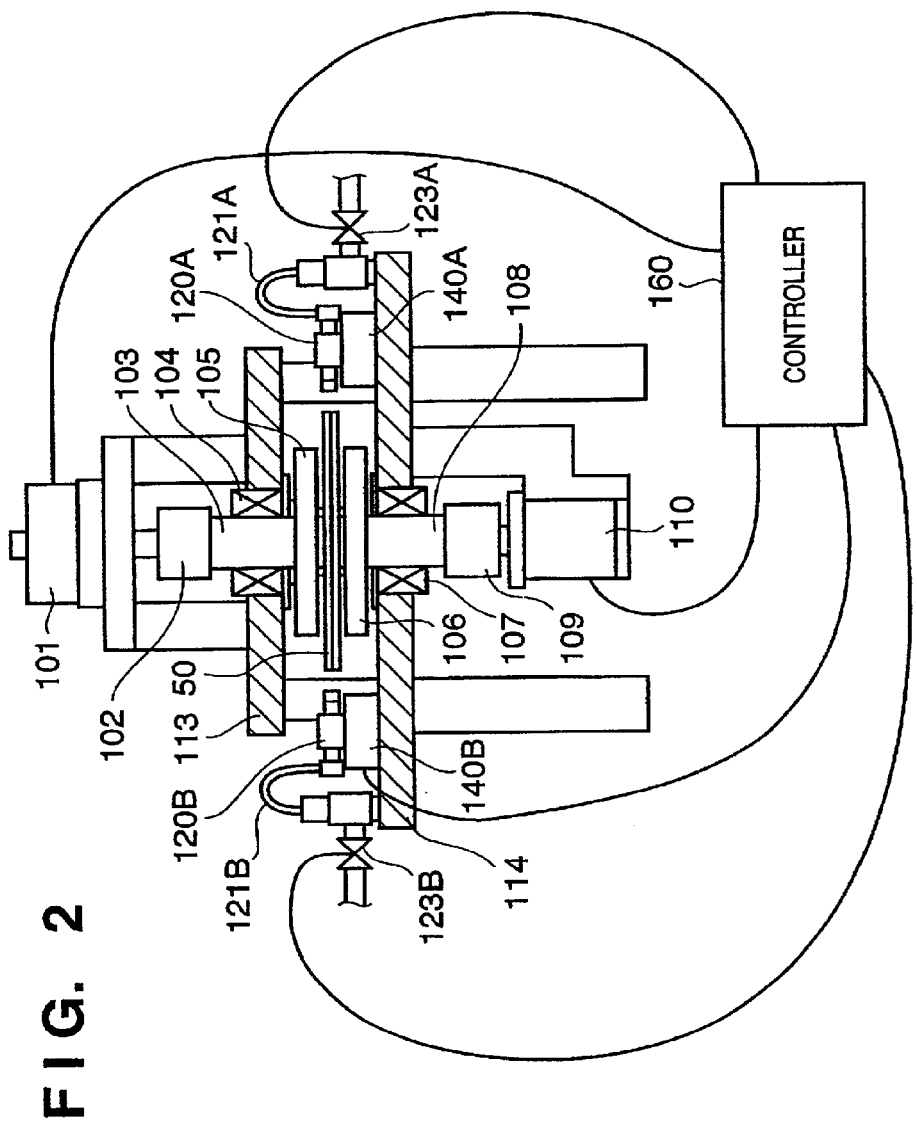
FIG. 2 is a view showing the arrangement of a separating apparatus according to a preferred embodiment of the present invention.

FIG. 2 is a view showing the arrangement of a separating apparatus according to a preferred embodiment of the present invention. A separating apparatus 100 horizontally holds a bonded substrate stack 50 as a plate member to be separated and ejects a fluid (e.g., a liquid such as water, or a gas such as air) toward the outer side of the bonded substrate stack 50 while rotating it, thereby separating the bonded substrate stack 50 into two substrates at a porous layer (separation layer). This separating apparatus comprises as mechanisms for ejecting a fluid two ejecting nozzles (ejecting mechanisms) 120A and 120B whose widths in the direction of thickness of the separation layer of the bonded substrate stack 50 (i.e., the axial direction of the bonded substrate stack 50) are different from each other.

The bonded substrate stack 50 is held by a pair of substrate holding portions 105 and 106 which have a common central axis. The bonded substrate stack 50 may be held by a chuck mechanism provided in the respective holding surfaces of the pair of substrate holding portions 105 and 106 or clamped by the pair of substrate holding portions 105 and 106.

The upper substrate holding portion 105 is connected to a motor 101 through a rotating shaft 103 and coupling 102. The rotational speed of the motor 101 is arbitrarily controlled by a controller 160. The rotating shaft 103 is axially supported by an upper table 113 through a bearing 104.

The lower substrate holding portion 106 is connected to an air cylinder 110 through a rotating shaft 108 and coupling 109. Hence, the lower substrate holding portion 106 is vertically moved by the air cylinder 110. The air cylinder 110 is driven to set the bonded substrate stack 50 in the separating apparatus 100 and detach the separated substrates from the separating apparatus 100. The air cylinder 110 can also be driven to apply a press force or tensile force (when the bonded substrate stack is chucked) to the bonded substrate stack 50 as needed in separation processing. The air cylinder 110 is controlled by the controller 160. The rotating shaft 108 is axially supported by a lower table 114 through a bearing 107.

A first nozzle (first ejecting mechanism) 120A for ejecting a fluid to form a first jet with a first width (e.g., a first diameter) is arranged on the lower table 114. The position of the first nozzle 120A is adjusted, e.g., in a direction (vertical direction) parallel to the axial direction of the bonded substrate stack 50 and/or in a direction (horizontal direction) parallel to the planar direction of the bonded substrate stack 50 by a position adjusting mechanism 140A. Typically, the first nozzle 120A is directed by the position adjusting mechanism 140A to the center (e.g., the separation layer or bonding interface) of the concave portion of the bonded substrate stack 50 on the assumption that the bonded substrate stack 50 is appropriately held without any distortion. The first nozzle 120A is connected to a pump (not shown) through a high-pressure hose 121A, electromagnetic valve 123A, and high-pressure pipe (not shown).

A second nozzle (second ejecting mechanism) 120B for ejecting a fluid to form a second jet with a second width smaller than the first width is further arranged on the lower table 114. The position of the second nozzle 120B is adjusted, e.g., in a direction (vertical direction) parallel to the axial direction of the bonded substrate stack 50 and/or in a direction (horizontal direction) parallel to the planar direction of the bonded substrate stack 50 by a position adjusting mechanism 140B. Typically, the second nozzle 120B is directed by the position adjusting mechanism 140B to the center (e.g., the separation layer or bonding interface) of the concave portion of the bonded substrate stack 50 on the assumption that the bonded substrate stack 50 is appropriately held without any distortion. The second nozzle 120B is connected to a pump (not shown) through a high-pressure hose 121B, electromagnetic valve 123B, and high-pressure pipe (not shown).

A single supply source may be used as a supply source (the above-described pump) for supplying a fluid to the first nozzle 120A and supply source (the above-described pump) for supplying a fluid to the second nozzle 120B. Preferably, supply sources are provided separately to supply the fluid to the nozzles 120A and 120B at respective optimum pressures.

FIG. 3 is an enlarged view of the nozzle 120A (or 120B) and part of the bonded substrate stack 50. As shown in FIG. 3, the bonded substrate stack 50 to be separated preferably has a γ-shaped concave portion 51 in its section. Forming the concave portion 51 in the bonded substrate stack 50 enables a fluid from the nozzle 120A or 120B to be efficiently injected into the separation layer 12, thus resulting in smooth separation at the separation layer 12. As described previously, this concave portion 51 is formed when a bonded substrate stack is formed using a first substrate (seed wafer) and second substrate (handle wafer), each of which is a general wafer that has a beveling portion with a round sectional shape.

Preferably, each of the first and second substrates 10 and 20 constituting the bonded substrate stack 50 has a thickness of 100 to 2,000 $\mu$m and, typically, about 700 $\mu$m. A width G of the concave portion 51, which is formed when each of the first and second substrates 10 and 20 has a thickness of 700 $\mu$m, is about 700 $\mu$m.

FIG. 4 is a view showing a state wherein the outer portion of the bonded substrate stack 50 is separated using the first jet with a first width from the first nozzle 120A. As described above, the width of the first jet in the direction of thickness of the separation layer of the bonded substrate stack 50, i.e., the direction of thickness of the bonded substrate stack 50 (e.g., the diameter) is larger than that of the second jet from the second nozzle 120B. If a liquid such as water or the like is employed as a fluid under the condition described with reference to FIG. 3, the first width is preferably 0.5 to 1 mm, and more preferably, 0.5 to 0.75 mm. Preferably, the pressure of the first jet is 500 to 1,000 kgf/cm$^2$, and more preferably, 500 to 750 kgf/cm$^2$. Note that the pressure of the jet can appropriately be changed depending on the type of the fluid. To implement the width of the first jet as described above, a nozzle which is long in the direction of thickness of the bonded substrate stack or slit-like nozzle is also preferably used.

Even when there exists some distortion in the bonded substrate stack 50, or the bonded substrate stack 50 is held at a position deviated from an ideal position due to some foreign substance between the substrate holding portions and bonded substrate stack 50, the outer portion of the bonded substrate stack 50 can reliably be separated by separating the outer portion at the separation layer using the first jet with a relatively large width as described above. Note that if the separation layer is not exposed to the outer portion, the outer portion may be etched to be exposed, or a sharp blade may be inserted into the outer portion in the vicinity of the separation layer.

FIG. 5 is a view showing a state wherein a portion 50b inside the outer portion of the bonded substrate stack 50 is separated using the second jet with a second width from the second nozzle 120B. The size of the outer portion is not limited to that shown in FIG. 5. The size may be either smaller or larger than this.

As described above, the width of the second jet in the direction of thickness of the separation layer of the bonded substrate stack 50, i.e., the direction of thickness of the bonded substrate stack 50 (e.g., the diameter) is smaller than that of the first jet from the first nozzle 120A. If a liquid such as water or the like is employed as a fluid under the condition described with reference to FIG. 3, the second width is preferably 0.05 to 0.5 mm, and more preferably, 0.05 to 0.25 mm. Preferably, the pressure of the second jet is 50 to 500 kgf/cm$^2$, and more preferably, 100 to 500 kgf/cm$^2$.

The amount of the fluid to be injected inside the bonded substrate stack 50 can be decreased by separating the portion 50b inside an outer portion 50a at the separation layer using the second jet with a relatively small width as described above. This decreases the pressure applied from inside the bonded substrate stack 50 to the outside in the axial direction, thereby preventing damage to the bonded substrate stack 50. As shown in FIG. 5, the outer portion 50a of the bonded substrate stack 50 has already been separated, and a small amount of a fluid is injected into the separated portion to form a deep γ-shaped concave portion. For this reason, even the second jet with a small width can effectively apply pressure to the unseparated portion (the depths of the concave portion) of the separation layer.

Preferably, after the outer portion has been separated throughout its perimeter using the first jet, separation using the second jet is started. Alternatively, separation using the first jet and that using the second jet may be performed simultaneously during part of the entire period from the beginning to end of the separation processing. Injection of the first jet into the bonded substrate stack 50 must be ended after separation is completed from the outermost portion (edge) by a predetermined length. This is because the large amount of a fluid is injected into the bonded substrate stack 50 due to the width of the first jet larger than that of the second jet, and there exist a small number of escapes (discharge paths) in the central portion of the bonded substrate stack 50, thus possibly causing an excessive pressure to be applied inside the bonded substrate stack 50. When the bonded substrate stack 50 is to be separated while injecting a fluid into it, the first jet may be used first while the bonded substrate stack 50 is rotated at least once, preferably five times, and then the second jet may be used.

FIG. 6 is a view showing an example of the positional relationship between the first and second nozzles, and the bonded substrate stack 50. The first nozzle 120A and second nozzle 120B are typically arranged with an arbitrary angular difference (e.g., 90°, 180°, or the like) between them with respect to a rotational axis (center of rotation). In FIG. 2, the first nozzle 120A and second nozzle 120B are arranged with an angular difference of 180° between them.

Any one of the nozzles may be directed toward the center of the bonded substrate stack 50, or may not be directed toward the center. To separate the outer portion of the bonded substrate stack 50 more efficiently, any nozzle is preferably directed to a direction deviated from the center of the bonded substrate stack 50.

The overall flow of a separating method using the separating apparatus 100 will be described next.

First, the air cylinder 110 is actuated to move the lower substrate holding portion 106 downward, and the bonded substrate stack 50 is transferred to a predetermined position between the pair of substrate holding portions 105 and 106 by a transfer robot or the like. The air cylinder 110 is actuated to move the lower substrate holding portion 106 upward and cause the pair of substrate holding portions 105 and 106 to hold the bonded substrate stack 50. If the pair of substrate holding portions 105 and 106 have a chuck mechanism, they may be actuated to chuck the bonded substrate stack 50. In addition, a press force or tensile force may be applied to the bonded substrate stack 50 by the air cylinder 110. The bonded substrate stack 50 may be held by applying a press force to the bonded substrate stack 50 by the air cylinder 110 without chucking the bonded substrate stack 50.

Separation of the outer portion of the bonded substrate stack 50 is started by opening the electromagnetic valve 121A to eject the first jet with the first width from the first nozzle 120A, and at the same time, driving the motor 101 to rotate the bonded substrate stack 50, under control by the controller 160. After an arbitrary period of time has passed (for example, after a portion separated using the first jet has arrived at a position opposing the second nozzle 120B while rotating), the electromagnetic valve 121B is opened to eject the second jet from the second nozzle 120B under control by the controller 160. If formation of the first and second jets is controlled at a timing at which the second jet is injected into only a separated portion of the outer portion, the second jet substantially contributes only to separation of the portion inside the outer portion of the bonded substrate stack 50. The first jet is preferably stopped after separation of the outer portion of the bonded substrate stack 50 is complete, typically after injection of the first jet is started and then the bonded substrate stack 50 is rotated once.

The bonded substrate stack 50 is separated into two substrates completely to the center, typically after the outer portion is separated throughout its perimeter and then the bonded substrate stack 50 is rotated several times.

After the bonded substrate stack 50 is separated, the air cylinder 110 is actuated to move the lower substrate holding portion 106 downward. The two separated substrates are received from the substrate holding portions 105 and 106 by, e.g., a transfer robot.

Figure 7A:
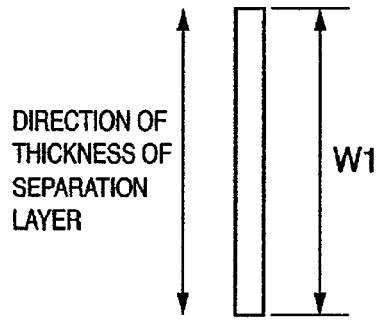
FIGS. 7A to 7D are views showing examples of a typical sectional shape of a jet formed by the first or second nozzle.
Figure 7B:
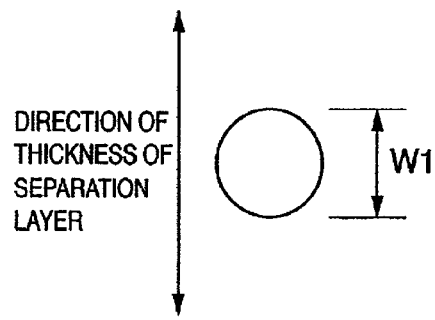
Figure 7C:
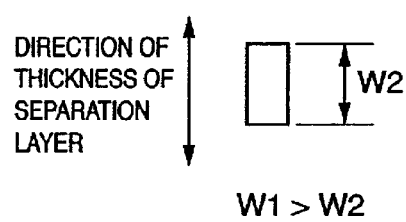
Figure 7D:
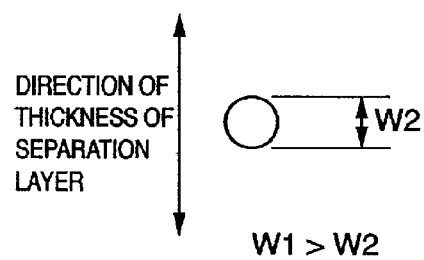

FIGS. 7A to 7D are views showing examples of a typical sectional shape of a jet formed by the first nozzle 120A or second nozzle 120B. FIG. 7A shows an example of a jet with a rectangle sectional shape formed by the first nozzle 120A; FIG. 7B, that of a jet with a circular sectional shape from the first nozzle 120A; FIG. 7C, that of a jet with a rectangle sectional shape formed by the second nozzle 120B; and FIG. 7D, that of jet with a circular sectional shape from the second nozzle 120B. A width W1 of the first jet is larger than a width W2 of the second jet.

FIG. 8 is a view showing a modification of the separating apparatus shown in FIG. 2. In FIG. 8, only the substrate holding portions and nozzles are shown. The other components are the same as those of the separating apparatus shown in FIG. 2. In the modification shown in FIG. 8, three ejecting nozzles 120A to 120C are provided as a plurality of nozzles (ejecting mechanisms) to form a plurality of jets with widths different from each other.

The plurality of nozzles 120A to 120C, which form jets with widths different from each other, may have positions different from each other in a direction (vertical direction) perpendicular to the separation layer of the bonded substrate stack 50 (the holding surfaces of the substrate holding portions). For example, the nozzle 120A may be arranged at a position with a reference level (Δh=0), the nozzle 120B may be arranged at a position (Δh=+0.05 mm) shifted from the reference level by a predetermined distance (in this case, 0.05 mm) in the positive direction, and the nozzle 120C may be arranged at a position (Δh=−0.05 mm) shifted from the reference level by a predetermined distance (in this case, 0.05 mm) in the negative direction. The positions of the plurality of nozzles 120A to 120c may be adjusted respectively by the same position adjusting mechanisms as the above-described position adjusting mechanisms 140A to 140C as needed (for example, by the allowable desired distortion amount of the bonded substrate stack).

In this modification, the bonded substrate stack 50 is separated while ejecting a fluid (jet) simultaneously or selectively from the first to third nozzles 120A to 120C under the control of the controller 160. An example of control by the controller 160 will be described next.

At the first stage of separation processing, the outer portion of the bonded substrate stack 50 is separated while selectively ejecting a fluid from the nozzle 120A which forms a jet with the first width W1, and at the second stage of separation processing, the outer portion of the bonded substrate stack 50 is separated while selectively ejecting the fluid from the nozzle 120B which forms a jet with the second width W2 smaller than the first width W1. At the third stage of separation processing, the outer portion of the bonded substrate stack 50 is separated while selectively ejecting a fluid from the nozzle 120C which forms a jet with the third width W3 smaller than the second width W2. With these stages of separation processing, the outer portion of the bonded substrate stack 50 is separated throughout its perimeter. At the fourth stage of separation processing, a fluid is ejected typically from the nozzle 120C to completely separate the bonded substrate stack 50 at the entire area of the separation layer.

Note that in the present invention, a liquid such as water or an etchant, a gas such as air, nitrogen or argon, a fluid mixture of liquid and gas, or the like may be used as a fluid.

Next, a method of manufacturing a substrate will be described as an application of the above separating method. FIGS. 1A to 1E are views for explaining a method of manufacturing a substrate having, e.g., an SOI structure according to a preferred embodiment of the present invention.

In the step shown in FIG. 1A, a single-crystal Si substrate 11 to be used to form a first substrate (seed wafer) 10 is prepared, and a porous Si layer 12 serving as a separation layer is formed on the major surface of the single-crystal Si substrate 11. The porous Si layer 12 can be formed by, e.g., anodizing the single-crystal Si substrate 11 in an electrolyte solution (anodizing solution).

As the electrolyte solution, for example, a solution containing hydrogen fluoride, a solution containing hydrogen fluoride and ethanol, a solution containing hydrogen fluoride and isopropyl alcohol, or the like can be used. More specifically, as the electrolyte solution, for example, a solution mixture containing an HF aqueous solution (HF concentration=49 wt %) and ethanol at a volume ratio of 2:1 can be used.

The porous Si layer 12 may have a multilayered structure including two or more layers with different porosities. The porous Si layer 12 having a multilayered structure preferably includes a first porous Si layer with a first porosity on the surface side, and, under the first porous Si layer, a second porous Si layer with a second porosity higher than the first porosity. With such a multilayered structure, a non-porous layer 13 free from defects can be formed on the first porous Si layer in the step of forming the non-porous layer 13 later, and a bonded substrate stack can be separated at a desired position in the separation step later. The first porosity is preferably 10% to 30% and, more preferably, 15% to 25%.

The second porosity is preferably 35% to 70% and, more preferably, 40% to 60%.

When the above solution mixture (49 wt % hydrofluoric acid:ethanol=2:1) is used as the electrolyte solution, preferably, for example, the first layer (surface side) is formed at a current density of 8 mA/cm$^2$ for a process time of 5 to 11 min, and the second layer (inner surface side) is formed at a current density of 23 to 33 mA/cm$^2$ for a process time of 80 sec to 2 min.

Next, at least one of the following steps (1) to (4) is preferably executed. The steps (1) and (2) are preferably executed in this order. More preferably, the steps (1), (2), and (3), or (1), (2), and (4) are executed in this order. Most preferably, the steps (1), (2), (3), and (4) are executed in this order.

(1) Step of Forming Protective Film on Porous Walls in Porous Si Layer (Pre-Oxidation Step)

In this step, a protective film such as an oxide film or nitride film is formed on the porous walls in the porous Si layer 12, thereby preventing any increase in porous size by subsequent annealing. The protective film can be formed by performing annealing in an oxygen atmosphere (preferably at, e.g., 200° C. to 700° C., and more preferably at 300° C. to 500° C.). After that, the oxide film or the like formed on the surface of the porous Si layer 12 is preferably removed. This can be done by, e.g., exposing the surface of the porous Si layer 12 to a solution containing hydrofluoric acid.

(2) Hydrogen Baking Step (Pre-Baking Step)

In this step, the first substrate 10 on which the porous Si layer 12 is formed is annealed in a reduction atmosphere containing hydrogen at 800° C. to 1,200° C. With this annealing, pores on the surface of the porous Si layer 12 can be sealed to some extent. If a native oxide film is present on the surface of the porous Si layer 12, it can be removed.

(3) Trace Material Supply Step (Pre-Injection Step)

When the non-porous layer 13 is to be grown on the porous Si layer 12, it is preferably grown at a low speed by supplying a trace amount of raw material substance of the non-porous layer 13 at the initial stage of growth. With this growing method, atomic migration on the surface of the porous Si layer 12 is promoted, and pores on the surface of the porous Si layer 12 can be sealed. More specifically, the supply of the raw material is controlled such that the growth rate becomes 20 nm/min or less, preferably 10 nm/min or less, and more preferably, 2 nm/min or less.

(4) High-Temperature Baking Step (Intermediate Baking Step)

When annealing is executed in a reduction atmosphere containing hydrogen at a temperature higher than that in the above hydrogen baking step and/or trace material supply step, further sealing and flattening of the porous Si layer 12 can be realized.

Figure 1B:
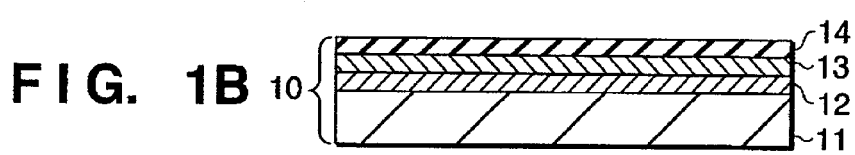

At the first stage of the step shown in FIG. 1B, the first non-porous layer 13 is formed on the porous Si layer 12. As the first non-porous layer 13, an Si layer such as a single-crystal Si layer, poly-Si layer, or amorphous Si layer, Ge layer, SiGe layer, SiC layer, C layer, GaAs layer, GaN layer, AlGaAs layer, InGaAs layer, InP layer, or InAs layer can be used. Needless to say, layers made of the above-described materials may be used in combination as the first non-porous layer 13, as needed. For example, a non-porous single-crystal Si layer may be formed on the porous Si layer 12, an SiGe layer may be formed on the non-porous single-crystal Si layer, and another non-porous single-crystal Si layer may be formed on the SiGe layer.

At the second stage of the step shown in FIG. 1B, an SiO$_2$ layer (insulating layer) 14 as the second non-porous layer is formed on the first non-porous layer 13. With this process, the first substrate 10 is obtained. The SiO$_2$ layer 14 can be formed, e.g., in an O$_2$/H$_2$ atmosphere at 1,100° C. for 10 to 33 min.

Figure 1C:
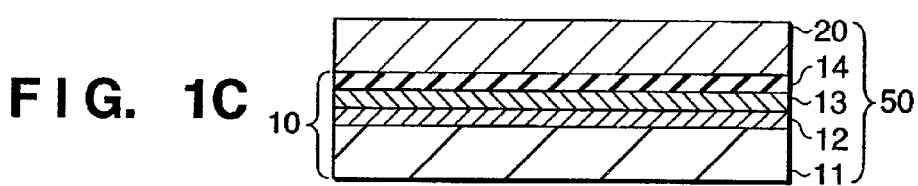

In the step shown in FIG. 1C, a second substrate (handle wafer) 20 is prepared and brought into tight contact with the first substrate 10 at room temperature while making the insulating layer 14 face the second substrate 20, thereby forming a bonded substrate stack 30.

The insulating layer 14 can be formed either on the single-crystal Si layer 13 side, or on the second substrate 20, or on both the single-crystal Si layer 13 and the second substrate 20 as long as the state shown in FIG. 1C is obtained when the first and second substrates are brought into tight contact with each other. However, when the insulating layer 14 is formed on the first non-porous layer (e.g., a single-crystal Si layer) 13 side serving as an active layer, as described above, the bonding interface between the first substrate 10 and the second substrate 20 can be separated from the active layer, and a semiconductor substrate such as an SOI substrate with a higher quality can be obtained.

After the substrates 10 and 20 are completely brought into tight contact, processing of strengthening bonding between the substrates is preferably executed. As an example of this processing, processing of, e.g., 1) executing annealing in an N$_2$ atmosphere at 1,100° C. for 10 min and 2) executing annealing (oxidation) in an O$_2$/H$_2$ atmosphere at 1,100° C. for 50 to 100 min is preferably performed. In addition to this processing, or in place of this processing, anodic bonding and/or compression may be executed.

As the second substrate 20, an Si substrate, a substrate obtained by forming an SiO$_2$ layer on an Si substrate, a transparent substrate formed from quartz or the like, or a sapphire substrate can be used. However, a substrate of another type which has a sufficiently flat surface to be bonded may be used as the second substrate 20.

Figure 1D:
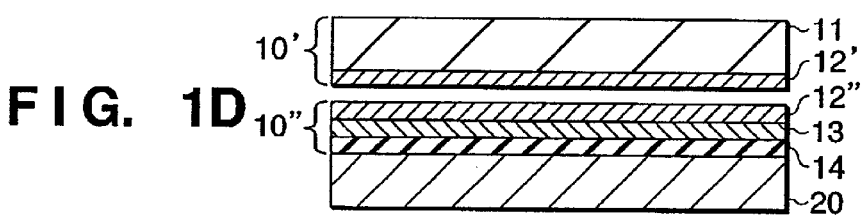

In the step shown in FIG. 1D, the bonded substrate stack 30 is separated at the fragile porous layer 12 with a low mechanical strength using the above-described separating method.

Figure 1E:
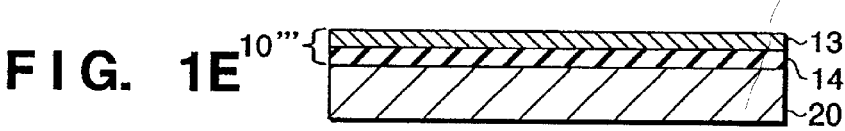

In the step shown in FIG. 1E, a porous layer 12" on the first non-porous layer 13 of the separated second substrate 20 is selectively removed by etching or the like.

A porous layer 12' on the single-crystal Si substrate 11 of a separated first substrate 10' is selectively removed by etching or the like. The single-crystal Si substrate 11 obtained in this way can be reused as a substrate for forming the first substrate 10 or as the second substrate 20.

As a bonded substrate stack, a substrate prepared by the following method may be employed. First, a semiconductor substrate represented by a single-crystal Si substrate such as a mirror wafer or epitaxial wafer is prepared. An insulating film such as a thermal silicon oxide film is formed on the surface of the substrate, as needed. Next, ions such as positive or negative hydrogen ions or rare gas ions are implanted into the substrate by ion implantation using a line beam or plasma immersion, thereby forming a relatively heavily doped ion implantation layer serving as a separation layer at a predetermined depth from the surface. The first substrate is obtained in the above manner.

Next, the second substrate is prepared according to the same procedure as described above and bonded to the first substrate in accordance with the above-described bonding method. With this process, a bonded substrate stack having a layer to be transferred (transfer layer) inside can be obtained.

The ion implantation layer is distorted or contains defects or pores formed from microcavities due to the implanted ions. Such an ion implantation layer has a relatively low mechanical strength and therefore functions as a separation layer. Note that the bonded substrate stack may be separated using a fluid as described above after annealing to the extent that the bonded substrate stack is not completely separated. In this case, annealing can enhance the bonding force in the bonding interface.

Even if the separation layer is not exposed to the outer portion of the bonded substrate stack, a tensile force is applied to the separation layer by ejecting the fluid into the bonded substrate stack, and thus the bonded substrate stack is separated at the separation layer.

A separating apparatus according to a preferred embodiment of the present invention is useful for separating a bonded substrate stack (an example of a member to be separated) which has a separation layer such as a porous layer formed by anodization or an ion implantation layer formed by ion implantation into two substrates at the separation layer. In FIG. 1D, it is shown that separation occurs inside the separation layer. However, the bonded substrate stack may be separated at the interface between the porous Si layer 12 and non-porous layer 13, and/or the interface between the single-crystal Si substrate 11 and porous Si layer 12. Needless to say, it is also preferable to separate the bonded substrate stack almost at the interface between the porous Si layer 12 and non-porous layer 13 by controlling, e.g., the layer structure of the separation layer. Preferably, the surface of the non-porous layer 13 which has been transferred onto the second substrate is planarized by polishing and/or annealing (hydrogen annealing) in an atmosphere containing hydrogen, as needed.

[Example of Semiconductor Device]

A semiconductor device using a semiconductor substrate that can be manufactured by the above substrate manufacturing method (FIGS. 1A to 1E) and a method of manufacturing the device will be described next with reference to FIGS. 9A to 9D.

FIGS. 9A to 9D are sectional views showing a method of manufacturing a semiconductor device using a semiconductor substrate that can be manufactured using the substrate manufacturing method according to the preferred embodiment of the present invention.

First, an SOI substrate which has a semiconductor layer as a non-porous layer 13 and an insulating layer as a non-porous layer 14 is manufactured using the above substrate manufacturing method. An active region 13' where a transistor is to be formed and an element isolation region 54 are formed by a method of patterning the non-porous semiconductor layer (SOI layer) 13 on the buried insulating layer 14 into an island shape or an oxidation method called LOCOS (FIG. 9A).

Figure 9A:
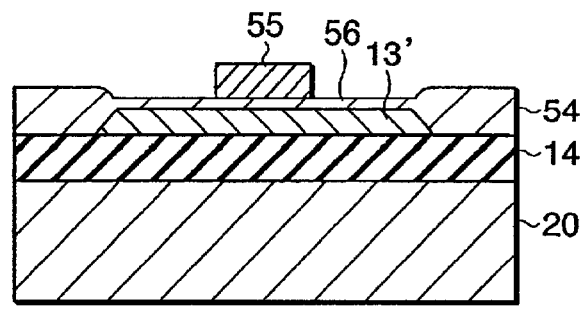
FIGS. 9A to 9D are sectional views showing a method of manufacturing a semiconductor device using a semiconductor substrate that can be manufactured using the substrate manufacturing method according to a preferred embodiment of the present invention.

Next, a gate insulating film 56 is formed on the surface of the SOI layer (FIG. 9A). Examples of the material of the gate insulating film 56 are silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, and a glass mixture thereof. The gate oxide film 56 can be formed by, e.g., oxidizing the surface of the SOI layer or depositing an appropriate substance on the surface of the SOI layer by CVD or PVD.

A gate electrode 55 is formed on the gate insulating film 56 (FIG. 9A). The gate electrode 55 can be formed from, e.g., polysilicon doped with a p- or n-type impurity, a metal such as tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate insulating film 56 may be formed by stacking a plurality of layers formed from different materials, like a polycide gate. The gate electrode 55 can be formed either by, e.g., a method called Salicide (self-align silicide) or by a method called a damascene gate process, or by any other method. With the above process, a structure shown in FIG. 9A is obtained.

Figure 9B:
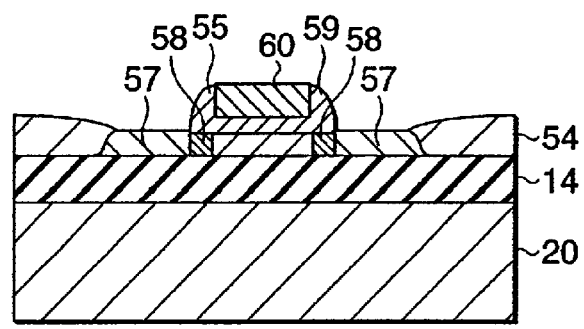

Next, an n-type impurity such as phosphor, arsenic, or antimony or a p-type impurity such as boron is doped into the active region 13', thereby forming relatively lightly-doped source and drain regions 58 (FIG. 9B). The impurity can be doped by, e.g., ion implantation and annealing.

An insulating film is formed to cover the gate electrode 55 and then etched back, thereby forming a side wall 59 on the side surface of the gate electrode 55.

An impurity having the same conductivity type as described above is doped into the active region 13' again, thereby forming relatively heavily-doped source and drain regions 57. With the above process, a structure shown in FIG. 9B is obtained.

Figure 9C:
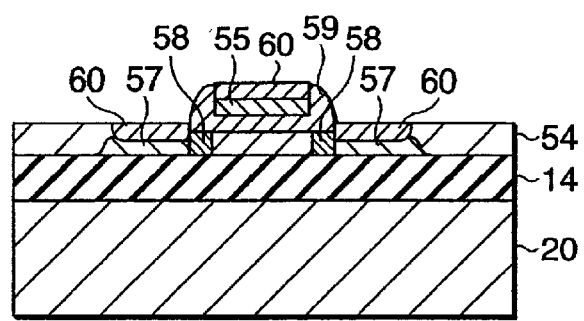

A metal silicide layer 60 is formed on the upper surface of the gate electrode 55 and on the upper surfaces of the source and drain regions 57. Examples of the material of the metal silicide layer 60 are nickel silicide, titanium silicide, cobalt silicide, molybdenum silicide, and tungsten silicide. Such a silicide can be formed by depositing a metal on the upper surface of the gate electrode 55 and on the upper surfaces of the source and drain regions 57, performing annealing to cause the metal to react with underlying silicon, and removing an unreacted portion of the metal using an etchant such as sulfuric acid. The surface of the silicide layer may be nitrided as needed. With the above process, a structure shown in FIG. 9C is obtained.

Figure 9D:
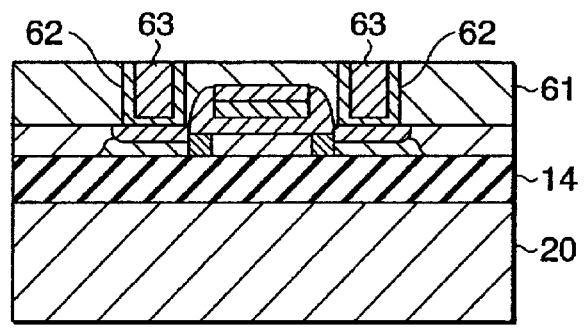
Figure 10:
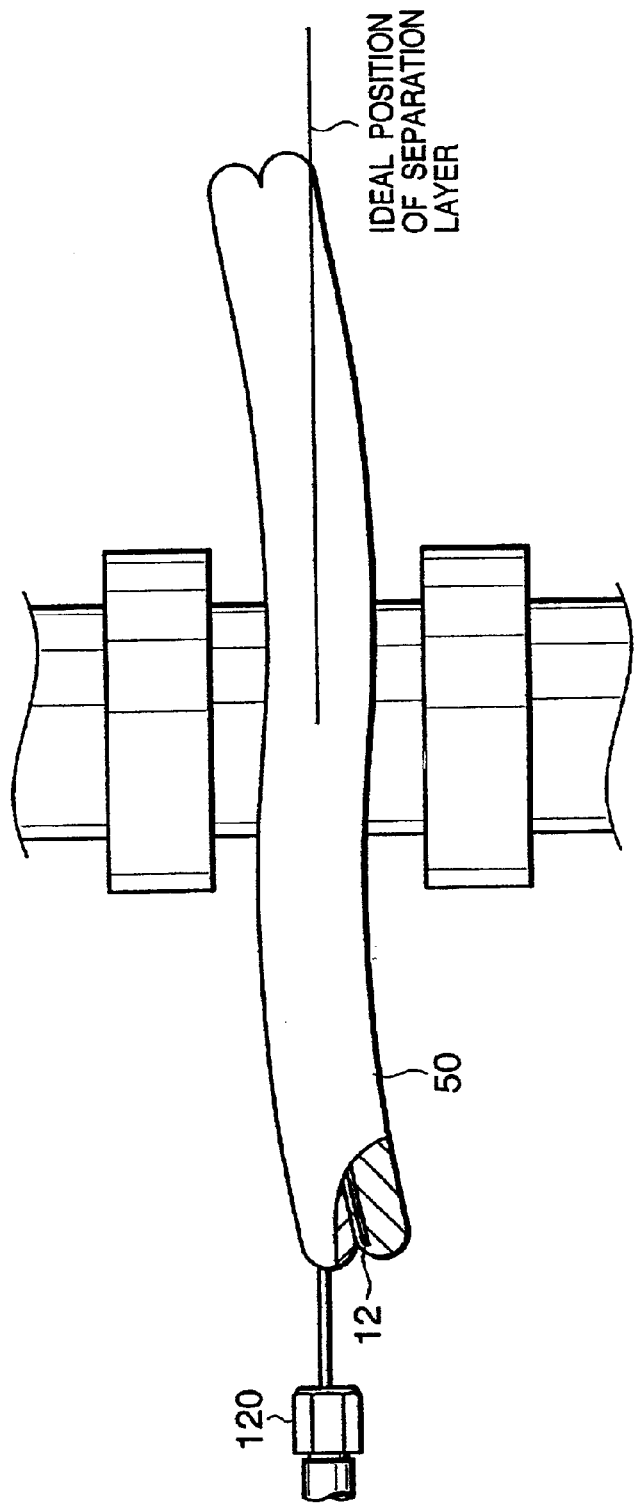
FIG. 10 is a view showing a state wherein a bonded substrate stack which is largely distorted is separated into two substrates at a porous layer.

An insulating film 61 is formed on the upper surface of the gate electrode and on the upper surfaces of the source and drain regions, which are converted into a silicide (FIG. 9D). As the material of the insulating film 61, silicon oxide containing phosphor and/or boron can be used.

Contact holes are formed in the insulating film 61 by CMP, as needed. When photolithography using a KrF excimer laser, ArF excimer laser, $F_2$ excimer laser, electron beam, or X-rays is used, a rectangular contact hole with a side smaller than 0.25 μm or a circular contact hole having a diameter smaller than 0.25 μm can be formed.

Next, the contact holes are filled with a conductor. To fill the contact holes with a conductor, a film of a refractory metal or a nitride thereof, which serves as a barrier metal 62, is formed on the inner surface of each contact hole, and after that, a conductor 63 such as a tungsten alloy, aluminum, aluminum alloy, copper, or copper alloy is deposited by CVD, PVD, or plating. A conductor may be deposited to a level higher than the upper surface of the insulating film 61 and removed by etch back or CMP. Alternatively, before the contact holes are filled with the conductor, the surface of the silicide layer in the source and drain regions, which is exposed to the bottom portion of each contact hole, may be nitrided. With the above process, a transistor such as an FET can be formed on the SOI layer, and a semiconductor device having a transistor with a structure shown in FIG. 9D can be obtained.

When the thickness and impurity concentration of the active layer (SOI layer) 13' are defined such that a depletion layer formed upon applying a voltage to the gate electrode reaches the upper surface of the buried insulating layer 14, the formed transistor operates as a fully depleted transistor. When the thickness and impurity concentration of the active layer (SOI layer) 13' are defined such that the depletion layer does not reach the upper surface of the buried insulating layer 14, the formed transistor operates as a partially depleted transistor.

According to the present invention, in separating a member which has a separation layer such as a bonded substrate stack, the member can always be separated appropriately regardless of some distortion in the member, insufficient accuracy in holding the member, or the like.

As many apparently widely different embodiments of the present invention can be made without departing from the spirit and scope thereof, it is to be understood that the invention is not limited to the specific embodiments thereof except as defined in the claims.

What is claimed is:

1. A method of separating a member which has a separation layer inside using a jet, comprising:
   the first step of injecting a jet with a first width into an outer portion of the member to separate the outer portion of the member; and
   the second step of injecting a jet with a second width smaller than the first width into the member to separate the member.

2. The method according to claim 1, wherein
   in the first step, a pressure of the jet with the first width is applied to the separation layer at the outer portion,
   in the second step, a pressure of the jet with the second width is applied to the separation layer at a portion inside the outer portion of the member.

3. The method according to claim 1, wherein the first and second widths are widths in a direction of thickness of the separation layer.

4. The method according to claim 1, wherein the jet with the first width and the jet with the second width are formed by ejecting mechanisms different from each other.

5. The method according to claim 1, wherein the pressure of the jet with the first width is higher than that of the jet with the second width.

6. The method according to claim 1, wherein the second step is performed after the outer portion of the member is separated almost throughout a perimeter of the member in the first step.

7. The method according to claim 1, wherein the first step and second step are performed simultaneously during part of an entire period from a beginning to end of separation processing.

8. The method according to claim 1, wherein the first width is 0.5 to 1 mm, and the second width is 0.05 to 0.5 mm.

9. The method according to claim 1, wherein the pressure of the jet with the first width is 500 to 1,000 kgf/cm$^2$, and the pressure of the jet with the second width is 50 to 500 kgf/cm$^2$.

10. The method according to claim 1, wherein the member is rotated about an axis perpendicular to the separation layer in the first step.

11. The method according to claim 1, wherein the member is rotated about an axis perpendicular to the separation layer in the second step.

12. The method according to claim 1, wherein the member comprises a bonded substrate stack obtained by bonding a seed substrate which has a semiconductor layer on a separation layer to a handle substrate through an insulating layer.

13. The method according to claim 1, wherein the jet is obtained by ejecting a liquid or gas from an ejecting portion.

14. A semiconductor substrate manufacturing method characterized by comprising the steps of:

forming a bonded substrate stack as a member to be separated by bonding to a second substrate a first substrate which has a separation layer inside and a transfer layer on the separation layer; and separating the bonded substrate stack at the separation layer by using the separating method of any one of claims 1 to 13.

15. A semiconductor device manufacturing method comprising the steps of:

preparing an SOI substrate manufactured using the manufacturing method of claim 14; and element-isolating an SOI layer of the SOI substrate and forming a transistor on the element-isolated SOI layer.

16. The method according to claim 15, characterized in that the transistor is a partially depleted FET.

17. The method according to claim 15, characterized in that the transistor is a fully depleted FET.

* * * * *